United States Patent [19]

Kawashima

[11] Patent Number: 4,866,675
[45] Date of Patent: Sep. 12, 1989

[54] SEMICONDUCTOR MEMORY CIRCUIT HAVING A DELAY CIRCUIT

[75] Inventor: Shoichiro Kawashima, Yokohama, Japan

[73] Assignee: Fujitsu Limited, Japan

[21] Appl. No.: 228,463

[22] Filed: Aug. 5, 1988

[30] Foreign Application Priority Data

Aug. 7, 1987 [JP] Japan .................................. 62-197894

[51] Int. Cl.⁴ ........................................... G11C 13/00
[52] U.S. Cl. ................................ 365/194; 365/189.01; 365/193
[58] Field of Search ............... 365/189, 190, 193, 194, 365/195, 202, 230

[56] References Cited

U.S. PATENT DOCUMENTS

4,740,923  4/1988  Kaneko et al. .................... 365/194

Primary Examiner—Terrell W. Fears
Attorney, Agent, or Firm—Staas & Halsey

[57] ABSTRACT

A semiconductor memory circuit includes a variable delay circuit for delaying write data supplied from an external circuit such as a CPU by a delay time which is variably determined depending on a potential level of a write enable signal which is supplied from the external circuit and enables a write amplifier to write a delayed write data supplied from the delay circuit into a memory cell array.

16 Claims, 6 Drawing Sheets

SEMICONDUCTOR MEMORY CIRCUIT HAVING A DELAY CIRCUIT

BACKGROUND OF THE INVENTION

The present invention generally relates to a semiconductor memory circuit, and in particular to a semiconductor memory circuit such as a static random access memory and a dynamic random access memory. The present invention relates more particularly to a semiconductor memory circuit having a delay circuit which delays a write data signal and/or an address signal.

It is known that at the time of data write, a semiconductor memory circuit is provided with a write data signal, an address signal and a write enable signal from an external circuit such as a central processing unit (hereafter simply referred to as CPU). In a write cycle, there is defined a predetermined time relationship between the write data signal and the write enable signal which are generated by the CPU. That is, the predetermined relationship consists of a data setup time ($T_{DW}$) and a data hold time ($T_{DH}$). The data setup time defines a time duration between a time when the write data signal becomes valid and a time when the write enable signal disappears. The data hold time defines a time duration between a time when the write enable signal disappears and a time when the data signal becomes invalid. A sum (total time) of the data setup time and the data hold time corresponds to a data valid time.

A conventional semiconductor memory circuit includes a built-in delay circuit for delaying the write data signal applied to a data input terminal of the memory circuit in order to adjust timing of generation of the write data signal with respect to the write enable signal. For example, the Japanese Laid-Open Patent Application No. 203694/1983 discloses a memory circuit having a delay circuit of an inverter for delaying the write data signal by a fixed time $t_2$. The disclosed delay circuit delays each of the beginning and end of the write data signal by the time $t_2$. The delayed write data signal is supplied to a write amplifier built in the memory circuit.

Although the data setup time and the data hold time of the delayed write data signal are adjustable, the total time which is the sum thereof is always fixed. Therefore, when the data hold time is adjusted so as to be shortened, the data setup time is necessarily lengthened. Adversely when the data hold time is adjusted so as to be lengthened, the data setup time is necessarily shortened. That is, the conventional delay circuit cannot independently adjust timing of the beginning and end of the write data signal supplied from the CPU. Normally, both the data setup time and the data hold time which are determined by the CPU are required to be as short as possible in order to obtain a high-speed write operation. However, this requirement cannot be achieved by the above conventional memory circuit having the built-in delay circuit.

SUMMARY OF THE INVENTION

Accordingly, a general object of the present invention is to provide a novel and useful semiconductor memory circuit having a delay circuit in which the above disadvantage is eliminated.

A more specific object of the present invention is to provide a semiconductor memory circuit having a delay circuit capable of separately adjusting timing of the beginning and end of the input data signal, so that the data setup time and the data hold time of write data to be written into a memory cell can be independently adjusted.

The above objects of the present invention are achieved by a semiconductor memory circuit comprising the following elements. A memory cell array includes a plurality of memory cells. An address decoder decodes an address signal supplied from an external circuit, a decoded address signal being supplied to the memory cell array. A write amplifier writes write data supplied from the external circuit into the memory cell array. A sense amplifier reads out data stored in the memory cell array. A variable delay circuit delays the write data supplied from the external circuit by a delay time which is variably determined depending on a potential level of a write enable signal which is supplied from the external circuit and enables the write amplifier to write a delayed write data into the memory cell array.

The above objects of the present invention are also achieved by a semiconductor memory circuit comprising the following elements. A memory cell array includes a plurality of memory cells. An address decoder decodes an address signal supplied from an external circuit. A write amplifier writes write data supplied from the external circuit into the memory cell array. A sense amplifier reads out data stored in the memory cell array. An address buffer circuit delays an address signal supplied from the external circuit by a delay time which is variably determined depending on potential levels of row address and column address strobe signals which are supplied from the external circuit. An address decoder decodes a delayed address signal derived from the address buffer, a decoded address being supplied to the memory cell array.

Other objects, features and advantages of the present invention will become apparent from the following detailed description when read in conjunction with the accompanying drawings.

DETAILED DESCRIPTION OF THE PREFERRED EMBODIMENTS

Figure 1:
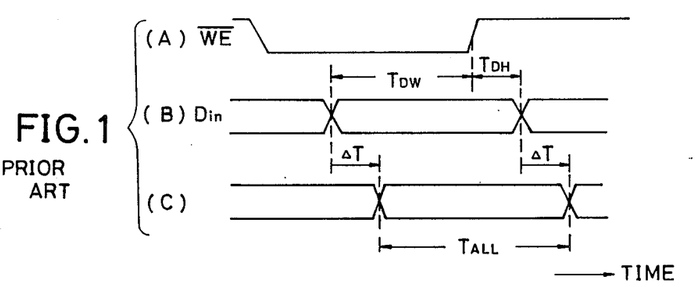
FIGS. 1(A) through 1(C) show waveforms of signals used in a conventional semiconductor memory circuit.

To facilitate the understanding of the present invention, a description is now given of a timing relationship between input and output terminals of a delay circuit built in a conventional semiconductor memory circuit with reference to FIGS. 1(A) through 1(C).

FIG. 1(A) shows a waveform of a write enable signal (a low active signal) $\overline{WE}$ at a write enable terminal of a memory circuit. FIG. 1(B) shows a waveform of a write data signal at a data input terminal of the memory circuit, or in other words at an input terminal of a built-in delay circuit. FIG. 1(C) shows a waveform of a delayed write data signal at an output terminal of the built-in delay circuit. $T_{DW}$ denotes the data setup time and $T_{DH}$ denotes the data hold time, which are determined by the CPU. The write data signal of FIG. 1(B) is delayed by a fixed time $\Delta T$ by the delay circuit, and the delayed write data signal of FIG. 1(C) is applied to a write amplifier provided in the memory circuit. That is, the beginning of the delayed write data signal lags by the delay time $\Delta T$ behind the beginning of the write data signal, and similarly the end of the delayed write data signal lags by the delay time $\Delta T$ behind the end of the write data signal. A data valid duration of the delayed write data signal into the memory, or obtained at the write amplifier is identical to a sum of the data setup time $T_{DW}$ and the data hold time $T_{DH}$ of the write data signal shown in FIG. 1(B). As described previously, when the data hold time $T_{DH}$ is shortened, the data setup time $T_{DW}$ is lengthened. In other words, it is impossible to shorten the delay times $\Delta T$ with respect to both the beginning and end of the write data signal.

A description is given of a preferred embodiment of the present invention with reference FIGS. 2 through 8.

Figure 2A:
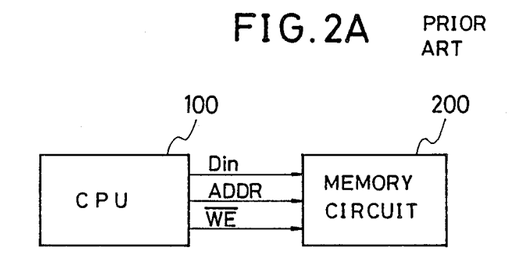
FIG. 2(A) is a block diagram showing a connection between a central processing unit and a semiconductor memory circuit.

FIG. 2(A) shows a connection between a CPU 100 and a memory circuit 200 provided by a preferred embodiment of the present invention. The memory circuit 200 is supplied with a write data signal Din, an address signal ADDR and a write enable signal $\overline{WE}$.

Figure 2B:
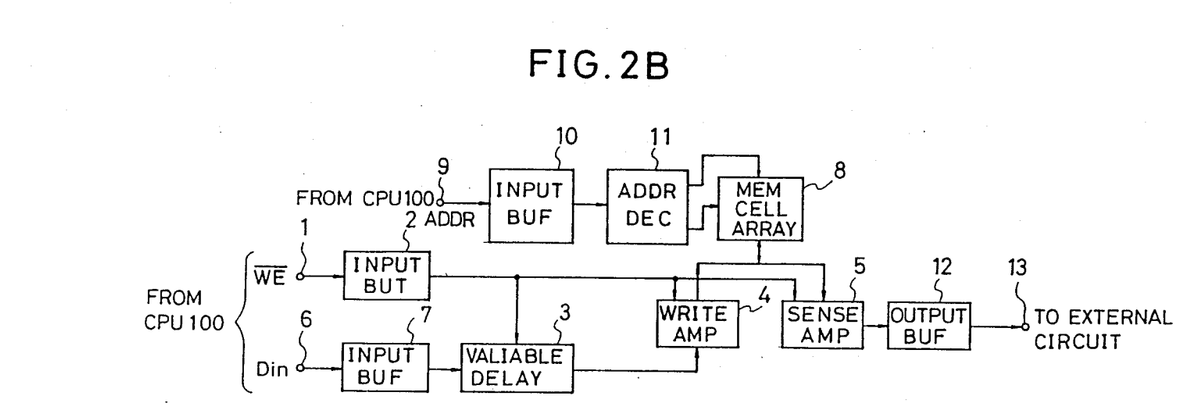
FIG. 2(B) is a block diagram of a preferred embodiment of the present invention.

FIG. 2(B) shows a detailed block configuration of the memory circuit 200. The configuration of FIG. 2(B) is with respect to a static random access memory circuit. Referring to FIG. 2(B), the write enable signal $\overline{WE}$ (low active signal) is supplied to an input buffer 2 through a write enable terminal 1 from the CPU 100. An output signal of the input buffer 2 is supplied to a variable delay circuit 3, a write amplifier 4 and a sense amplifier 5. The write data signal Din derived from the CPU 100 is supplied to an input buffer 7 through a data input terminal 6.

The variable delay circuit 3 provides the write data signal Din with a relatively small delay time when the write enable signal $\overline{WE}$ is kept at a low level, and on the other hand, provides the write data signal with a relatively large delay time when the write enable signal $\overline{WE}$ is kept at a high level. A delayed write data signal from the variable delay circuit 3 is supplied to the write amplifier 4.

The write amplifier 4 becomes active when the write enable signal $\overline{WE}$ is set at the low level and instructs a write-in operation of data. At this time, the delayed write data signal from the variable delay circuit 3 is supplied, through the write amplifier 4, to a memory cell array 8 having a plurality of memory cells. The address signal ADDR applied to an address terminal 9 is supplied to an address decoder 11 through an input buffer 10. The address decoder 11 indicates a memory cell designated by a decode output of the address decoder 11. Then, the write data from the write amplifier 4 is written into the designated memory cell.

During a data read-out operation possible activated when the write enable signal $\overline{WE}$ is set at the high level, the data stored in a memory cell designated by an address supplied from the address decoder 11 is read out by the sense amplifier 5, and is then outputted to an output terminal 13 through an output buffer 12.

Figure 3:
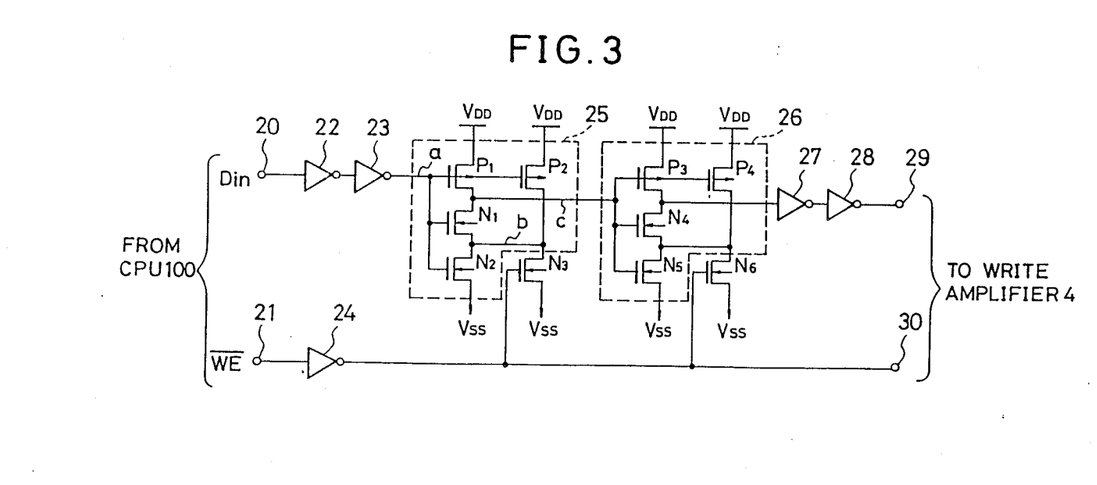
FIG. 3 is a circuit diagram of a variable delay circuit 3 shown in FIG. 2(B)
Figure 4:
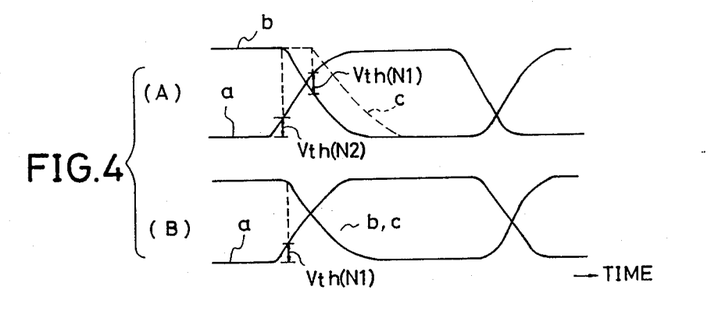
FIGS. 4(A) and 4(B) show waveforms of signals at portions in the variable delay circuit 3 of FIG. 3.
Figure 5:
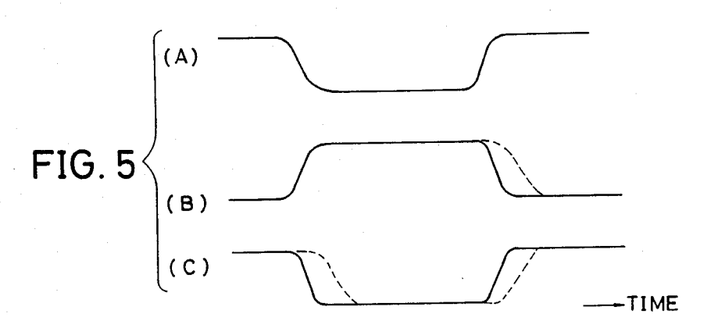
FIGS. 5(A) and 5(B) show waveforms of signals at input and output terminals of a Schmitt trigger inverter circuit at the first stage shown in FIG. 3, respectively.
FIG. 5(C) shows a waveforms of a signal at an output terminal of a Schmitt trigger inverter circuit at the second stage shown in FIG. 3.
Figure 6:
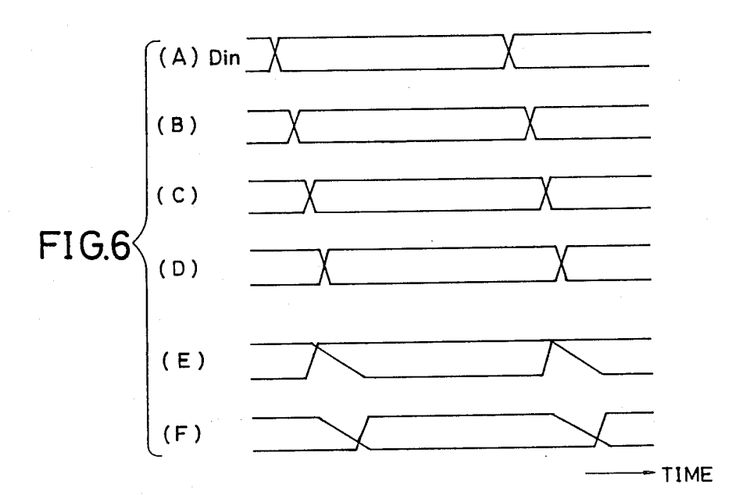
FIGS. 6(A) through 6(F) show waveforms at portions of the circuit of FIG. 3.
Figure 7:
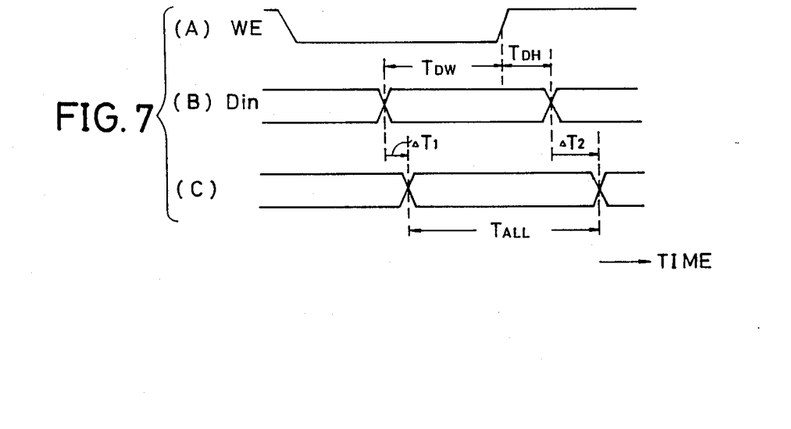
FIG. 7(A) through 7(C) show waveforms at portions of the circuit of FIG. 3.

FIG. 3 is a circuit diagram of one example of the variable delay circuit 3 shown in FIG. 2(B). The write data signal Din is supplied to a write data input terminal 20, and the write enable signal $\overline{WE}$ is supplied to a write enable terminal 21. The write data signal Din is supplied to gates of P-channel metal oxide semiconductor (MOS) field effect transistors (hereafter simply referred to as FET) P1 and P2 and gates of N-channel MOS FETs N1 and N2 through input buffers 22 and 23. The FETs P1 and N1 construct an inverter, and similarly the FETs P2 and N2 construct an inverter. Further, the FETs P1, P2, N1 and N2 construct a Schmitt trigger inverter circuit 25. Drains of the FETs P2 and N2 and a source of the FET N1 is connected to a drain of an N-channel FET N3. Sources of the FETs P1 and P2 are connected to a positive power source $V_{DD}$, and sources of the FETs N2 and N3 are connected to a negative power source $V_{SS}$.

The write enable signal $\overline{WE}$ is inverted by an inverter 24 which constructs an input buffer 2, and an inverted write enable signal $\overline{WE}$ is supplied to a gate of the FET N3. A source of the FET N3 is supplied with the power source voltage $V_{SS}$.

Drains of the FETs P1 and N1 which are mutually connected and function as an output of the Schmitt trigger inverter circuit 25, are connected to gates of P-channel FETs P3 and P4 and gates of N-channel FETs N4 and N5. The FETs P3, P4, N4 and N5 construct a Schmitt trigger circuit 26 which has the same configuration as the Schmitt trigger circuit 25. Drains of the FETs P4 and N5 and a source of the FET N4 are connected in common to a drain of an N-channel FET N6. A gate of the FET N6 is supplied with the output of the inverter 24, or the inverted write enable signal $\overline{WE}$.

FIG. 4(A) shows waveforms at different portions a, b and c in each of the Schmitt trigger inverter circuits 25 and 26 shown in FIG. 3, when the inverted write enable signal $\overline{WE}$ is maintained at the low level. During this state, the FET N3 is kept OFF. When the potential at the output of the inverter 23 reaches a threshold voltage Vth of the FET N2, the potential at the portion b starts decreasing. At this time, the potential at the portion c is still kept at the high level. Thereafter, when a difference in potential between portions a and b becomes equal to a threshold voltage Vth of the FET N1, the potential at the portion c starts decreasing. As a result, the fall time of the potential at the output of the Schmitt trigger inverter circuit 25 is longer than the rise time of the potential at the input thereof.

FIG. 4(B) shows waveforms at the portions a, b and c when the inverted write enable signal $\overline{WE}$ is maintained at the high level. As shown, when the potential at the portion a reaches the threshold voltage Vth of the FET N1, the potentials at portions b and c starts decreasing. In this case, the fall time of the potential at the output of the Schmitt trigger inverter circuit 25 is almost identical to the rise time of the potential at the input thereof. This is because the sources of the FETs N1 and N4 are supplied with the power source voltage $V_{SS}$ due to the conduction of the FETs N3 and N6.

FIG. 5(A) shows a waveform of the write data signal Din at the input of the Schmitt trigger inverter circuit 25, FIG. 5(B) shows waveforms of the output signal thereof, and FIG. 5(C) shows waveforms of the output signal of the Schmitt trigger inverter circuit 26. A broken line of FIG. 5(B) is a waveform obtained when the FET N3 is kept OFF, and a broken line of FIG. 5(C) is a waveform obtained when the FET N6 is kept OFF.

Therefore, when the write data signal Din shown in FIG. 6(A) is applied to the inverter 23 of the input buffer, and the signal shown in FIG. 6(B) is outputted therefrom, if the write enable signal $\overline{WE}$ is at the low level and therefore the FETs N3 and N6 are conducting, the Schmitt trigger inverter circuits 25 and 26 produce output signals shown in FIGS. 6(C) and 6(D). On the other hand, when the write enable signal $\overline{WE}$ is kept at the high level and therefore the FETs N3 and N6 are kept OFF, the Schmitt trigger inverter circuits 25 and 26 produce output signals shown in FIGS. 6(E) and 6(F). In this manner, the delay time provided by each of the Schmitt trigger inverter circuit 26 varies depending on the level of the write enable signal $\overline{WE}$.

The output signal of the Schmitt trigger inverter circuit 26 is supplied to a next stage of a circuit through inverters 27 and 28 which function as output buffers and an output terminal 29. The output of the inverter 24 is supplied to the next stage of the circuit through an output terminal 30.

In this manner, the beginning and end of the write data signal Din can be separately adjusted. In the above example, with respect to the write enable signal $\overline{WE}$ and write data signal Din of FIGS. 7(A) and 7(B), the variable delay circuit 3 shown in FIG. 1 produces an output signal shown in FIG. 6(C) in which a delay time $\Delta T1$ obtained when the write enable signal $\overline{WE}$ is at the low level is smaller than a delay time $\Delta T2$ obtained when the write enable signal $\overline{WE}$ is at the high level. As a result, a duration time $T_{ALL}$ of the delayed write data signal within the memory circuit is lengthened, compared to the duration time $(T_{DW}+T_{DH})$ of the write data signal obtained at the terminal 6 of the memory circuit shown in FIG. 2(B). Therefore both the data hold time $T_{DH}$ and the data setup time $T_{DW}$ can be shortened.

Figure 8:
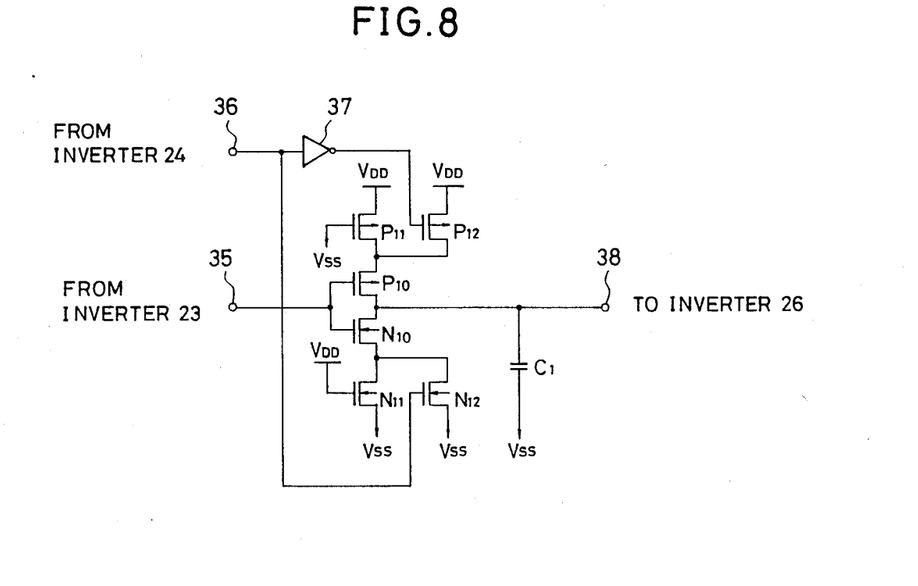
FIG. 8 is a circuit diagram of another circuit configuration which constructs each of the Schmitt trigger inverter circuits shown in FIG. 3.

FIG. 8 shows another circuit which constructs each of the Schmitt trigger inverter circuits 25 and 26 of the variable delay circuit 3 shown in FIG. 2(B). The signal derived from the inverter 23 shown in FIG. 3 is applied to a terminal 35, and the inverted write enable signal $\overline{WE}$ signal derived from the inverter 24 is applied to a terminal 36. FETs P10 and N10 with gates thereof connected to the terminal 35 construct an inverter. A source of FET P10 is connected to drains of FETs P11 and P12, each of which functions as a resistor. A source of FET N10 is connected to drains of FETs N11 and N12, each of which functions as a resistor. FETs P11 and N11 are always kept in conduction. FET P12 connected between the power source $V_{DD}$ and the FET P10 is supplied with a signal obtained by inverting the signal from the terminal 36 by an inverter 37. FET N12 connected between the power source $V_{SS}$ and the FET N10 is supplied with the signal from the terminal 36. Both the FETs P12 and N12 conduct when the write enable signal $\overline{WE}$ is maintained at the low level.

Drains of FETs P10 and N10 which are mutually connected are connected to an output terminal 38 and also to the power supply source $V_{SS}$ through a capacitor C1.

When the write enable signal $\overline{WE}$ is at the low level and therefore the FETs P12 and N12 are kept in condition, the cascade resistances provided by the FETs P11 and N11 which function as resistors, become relatively small. As a result, the delay time defined by the resistors and the capacitor C1 is relatively small. On the other hand, when the write enable signal is at the high level and therefore the FETs P12 and N12 are cutoff, the resistances provided only by the FETs P11 and N11 become relatively large. Hence, the delay time defined by the resistors and the capacitor C1 is relatively large.

In the case where each of the Schmitt trigger inverter circuits 25 and 26 is substituted with the circuit structure of FIG. 8, there can be obtained the advantages which are the same as those provided by the circuit configuration shown in FIG. 3. That is, the beginning and end of the write data signal can be independently adjusted.

Figure 9:
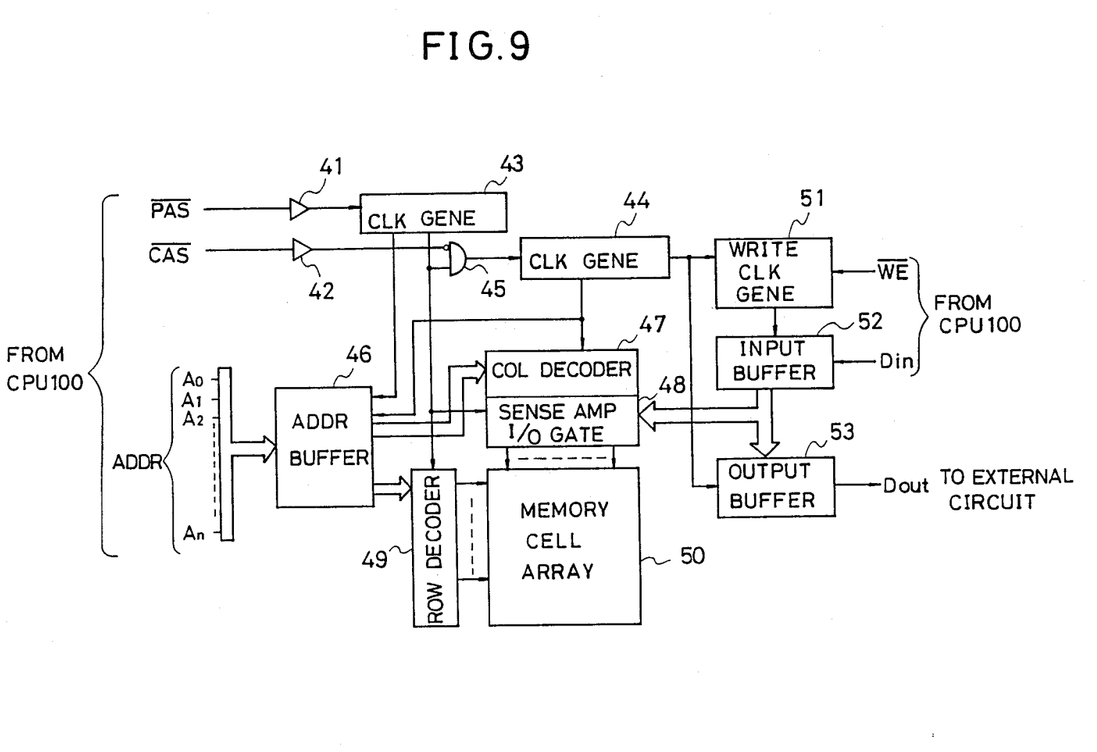
FIG. 9 is a block diagram of another embodiment of the present invention.
Figure 10:
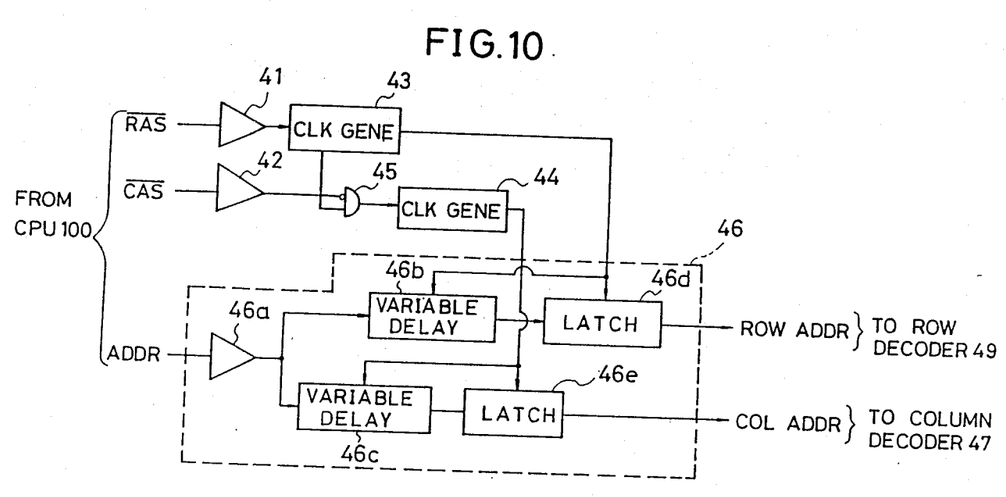
FIG. 10 is a detailed block diagram of an address buffer 46 shown in FIG. 9.
Figure 11:
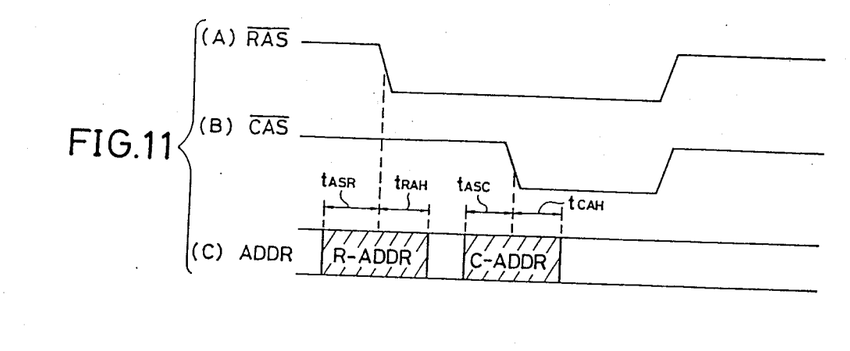
FIG. 11(A) through 11(C) show waveforms of signals at different portions of the block diagram of FIG. 10.

A description is given of another preferred embodiment of the present invention with respect to FIGS. 9 through 11.

A block diagram of FIG. 9 is with respect to a dynamic random access memory (DRAM) circuit. The DRAM illustrated in FIG. 9 is supplied, from the CPU 100, with a row address strobe signal $\overline{RAS}$, a column address strobe signal $\overline{CAS}$ (now shown in FIG. 2(A)) together with the write enable signal $\overline{WE}$, the write data signal Din, and the address signal ADDR. In the embodiment, a position on a time axis of the address signal with respect to the row address strobe signal $\overline{RAS}$ and the column address strobe signal $\overline{CAS}$, can be adjusted by an address buffer 46.

The row address strobe signal $\overline{RAS}$ is supplied to a clock generators 43 through an input buffer 41. The column address strobe signal $\overline{CAS}$ is supplied to a clock generator 44 through an input buffer 42 and an AND circuit 45, one input of which is connected to an inverter. The clock generators 43 and 44 generate corresponding clock signals which are row and column address strobe signals to be applied to the address buffer 46. The other input of the AND circuit 45 is supplied with a signal which is generated by the clock generator 43 and which indicates a fall of the row address strobe signal. The address signal ADDR consisting of bits $A_0$ through $A_n$ from the CPU 100 is supplied to an address buffer 46. An address signal outputted by the address buffer 46 is supplied to a column address decoder 47 and a row address decoder 49, which are also supplied with the row and column address strobe signals $\overline{RAS}$ and $\overline{CAS}$, respectively.

The write enable signal $\overline{WE}$ and the clock signal derived from the clock generator 44 is supplied to a write clock generator 51, which generates a timing signal to be supplied to an input buffer 52. The input buffer 52 inputs the write data signal Din in response to the timing signal from the write clock generator 51. An output signal is supplied to a sense amplifier and input/output (I/O) gate circuit 48 and also to an output buffer 53. The column decoder 47 decodes the address signal supplied from the address buffer 46 in response to the column address strobe signal $\overline{CAS}$ supplied from the clock generator 44. The row address decoder 49 decodes the address signal supplied from the address buffer 46 in response to the row address strobe signal $\overline{RAS}$ from the clock generator 43. The write data from the input buffer 52 is written, through the circuit 48, into a memory cell in a memory cell array 50 which is with respect to an address designated by the column and row address decoders 47 and 49.

A detailed block structure of the address buffer 46 is illustrated in FIG. 10. The address buffer includes an input buffer 46a, two variable delay circuits 46b and 46c, and two latch circuits 46d and 46e. The address signal ADDR from the CPU 100 is supplied to the variable delay circuits 46b and 46c through the input buffer 46a. A delay time which depends on the level of the row address strobe signal from the clock generator 43 is added to the address signal from the input buffer 46a. Similarly, a delay time which depends on the level of the column address strobe signal from the clock generator 44 is added to the address signal from the input buffer 46a. Each of the variable delay circuits 46b and 46c may be constructed by the Schmitt trigger inverter circuit shown in FIG. 3 or 8. For example, in FIG. 3, the address signal is supplied to the Schmitt trigger inverter circuit 25 in place of the write data signal Din, and the row address strobe signal $\overline{RAS}$ or the column address strobe signal $\overline{CAS}$ is supplied to the FETs N3 and N6. A delayed address signals derived from the variable delay circuits 46b and 46c are supplied to a latch circuits 46d and 46e, respectively. The latch circuits 46d and 46e latch the delayed address signal in response to the row and column address strobe signals $\overline{RAS}$ and $\overline{CAS}$, respectively. Outputs of the latch circuits 46d and 46e are supplied to the row address decoder 49 and column address decoder 47, respectively.

FIGS. 11(A) through 11(C) show waveforms of the row address strobe signal $\overline{RAS}$ at the variable delay circuit 46b, the row address strobe signal $\overline{CAS}$ at the variable delay circuit 46c, and the address signal ADDR at the variable delay circuits 46b and 46c. An address setup time $t_{ASR}$ of the row address signal and an address hold time $t_{RAH}$ thereof are independently adjustable with respect to the fall of the row address strobe signal $\overline{RAS}$. Likewise, an address setup time $t_{ASC}$ of the column address signal and an address hold time $t_{CAH}$ thereof are adjustable with respect to the fall of the column address strobe signal $\overline{CAS}$. For example, both of the address setup time $t_{ASR}$ of the row address signal address hold time $t_{RAH}$ can be set short. Similarly both of the address setup time $t_{ASC}$ address hold time $t_{CAH}$ can be set short.

The present invention is not limited to the embodiments aforementioned, and variations and modifications may be made without departing from the scope of the present invention.

What is claimed is:
1. A semiconductor memory circuit comprising:
a memory cell array including a plurality of memory cells;
address decoding means for decoding an address signal supplied from an external circuit, a decoded address signal being supplied to the memory cell array;
data writing means for writing write data supplied from the external circuit into the memory cell array;
data read-out means for reading out data stored in the memory cell array; and
variable delay means for delaying the write data supplied from the external circuit by a delay time which is variably determined depending on a potential level of a write enable signal which is supplied from the external circuit and enables the data write means to store a delayed write data supplied from the variable delay means into the memory cell array.

2. A semiconductor memory circuit as claimed in claim 1, wherein the variable delay means comprises Schmitt trigger means having two threshold levels with respect to the write data supplied from the external circuit.

3. A semiconductor memory circuit as claimed in claim 1, wherein the variable delay means comprises two Schmitt trigger inverter means which are connected in series and two control means provided for the respective Schmitt trigger inverter means for determining the delay time provided by the respective Schmitt trigger inverter means in response to the level of the write enable signal.

4. A semiconductor memory circuit as claimed in claim 3, wherein each of the Schmitt trigger inverter means comprises first and second complementary metal oxide semiconductor (CMOS) inverters.

5. A semiconductor memory circuit as claimed in claim 4, wherein the first inverter of each of the Schmitt trigger inverter means comprises first P-channel and N-channel transistors and the second inverter comprises second P-channel and N-channel transistors, and wherein drains of first and second P-channel transistors are connected to a positive power source, and a source of the second N-channel transistor is connected to a negative power source, and wherein drains of second P-channel and N-channel transistors and a source of the first N-channel transistor are connected to one another and also to the corresponding control means, and wherein gates of all the transistors are mutually connected to function as an input of each of the two Schmitt trigger inverter means, and wherein drains of the first P-channel and N-channel transistors are mutually connected to function as an output of each of the two Schmitt trigger inverter means.

6. A semiconductor memory circuit as claimed in claim 5, wherein each of the control means comprises an N-channel metal oxide semiconductor transistor, a drain of which is connected to the drain of the second P-channel transistor, and a source of which is connected to the negative power source, and wherein the write enable signal is supplied to gates of the N-channel MOS transistor of the control means through an inverter.

7. A semiconductor memory circuit as claimed in claim 1, wherein the variable delay means comprises two inverter circuits, and wherein each of the inverter circuits comprises a complementary metal oxide semiconductor (CMOS) inverter comprising a first P-channel transistor and a first N-channel transistor, and wherein gates of the first P-channel and N-channel transistors are connected to each other to function as an input to which the write data signal is applied, and drains thereof are connected to each other to function as an output through which an inverted signal of the write data signal is outputted, and wherein a source of the first P-channel transistor is connected to a positive power source through second and third P-channel transistors, and a source of the first N-channel transistor is connected to an negative power source through second and third N-channel transistors, and wherein gates of the second P-channel and N-channel transistors are connected to the negative and positive power source, respectively, and gates of the third N-channel and P-channel transistors are supplied to the write enable signal and an inverted signal thereof.

8. A semiconductor memory circuit as claimed in claim 1, wherein the variable delay means adds a relatively small delay time to the write data when the write enable signal is active, and wherein the variable delay means adds a relatively large delay time to the write data when the write enable signal is inactive.

9. A semiconductor memory circuit comprising:
a memory cell array including a plurality of memory cells;
data writing means for writing write data supplied from an external circuit into the memory cell array;
data read-out means for reading out data stored in the memory cell array;
address buffer means for delaying an address signal supplied from the external circuit by a delay time which is variably determined depending on potential levels of row address and column address strobe signals which are supplied from the external circuit; and
address decoding means for decoding a delayed address signal derived from the address buffer means, a decoded address being supplied to the memory cell array.

10. A semiconductor memory circuit as claimed in claim 9, wherein the address buffer means comprises two variable delay means each provided with respect to the respective row and column address strobe signals, and each of the variable delay means comprises a Schmitt trigger means having two threshold levels with respect to the address signal supplied from the external circuit.

11. A semiconductor memory circuit as claimed in claim 10, wherein each of the two variable delay means comprises two Schmitt trigger inverter means which are connected in series and two control means provided for the respective Schmitt trigger inverter means for determining the delay time determined by the respective Schmitt trigger inverter means in response to the levels of the row and column address strobe signals.

12. A semiconductor memory circuit as claimed in claim 11, wherein each of the Schmitt trigger inverter means comprises first and second complementary metal oxide semiconductor (CMOS) inverters.

13. A semiconductor memory circuit as claimed in claim 12, wherein the first inverter of each of the Schmitt trigger inverter means comprises first P-channel and N-channel transistors and the second inverter comprises second P-channel and N-channel transistors, and wherein drains of first and second P-channel transistors are connected to a positive power source, and a source of the second N-channel transistor is connected to a negative power source, and wherein drains of second P-channel and N-channel transistors and a source of the first N-channel transistor are connected to one another and also to the corresponding control means, and wherein gates of all the transistors are mutually connected to function as an input of each of the two Schmitt trigger inverter means, and wherein drains of the first P-channel and N-channel transistors are mutually connected to function as an output of each of the two Schmitt trigger inverter means.

14. A semiconductor memory circuit as claimed in claim 13, wherein each of the control means comprises an N-channel metal oxide semiconductor transistor, a drain of which is connected to the drain of the second P-channel transistor, and a source of which is connected to the negative power source, and wherein the corresponding address strobe signal is supplied to gates of the N-channel MOS transistor of the control means.

15. A semiconductor memory circuit as claimed in claim 9, wherein the variable delay means comprises two inverter circuits, and wherein each of the inverter circuits comprises a complementary metal oxide semiconductor (CMOS) inverter comprising a first P-channel transistor and a first N-channel transistor, and wherein gates of the first P-channel and N-channel transistors are connected to each other to function as an input to which the corresponding address strobe signal is applied, and drains thereof are connected to each other to function as an output through which an inverted signal of the address signal is outputted, and wherein a source of the first P-channel transistor is connected to a positive power source through second and third P-channel transistors, and a source of the first N-channel transistor is connected to an negative power source through second and third N-channel transistors, and wherein gates of the second P-channel and N-channel transistors are connected to the negative and positive power source, respectively, and gates of the third N-channel and P-channel transistors are supplied to the corresponding address strobe signal and an inverted signal thereof.

16. A semiconductor memory circuit as claimed in claim 9, wherein the address buffer means adds a relatively small delay time to the address signal when the row address and column address strobe signals are active, and wherein the address buffer means adds a relatively large delay time to the address signal when the row address and column address strobe signals are inactive.

* * * * *

UNITED STATES PATENT AND TRADEMARK OFFICE
CERTIFICATE OF CORRECTION

PATENT NO. : 4,866,675

DATED : September 12, 1989

INVENTOR(S) : Shoichiro KAWASHIMA

It is certified that error appears in the above-identified patent and that said Letters Patent is hereby corrected as shown below:

FRONT PAGE, Col. 2, after line 3, insert the following:

--FOREIGN PATENT DOCUMENTS--

58-203694  11/1983  Japan.............  --

Col. 2, line 57, change "shows a waveforms" to --shows a waveform--.
Col. 6, line 41, change "generators" to --generator--.
Col. 7, line 28, change "A delayed" to --Delayed--.
line 29, delete "a".

Signed and Sealed this

Eighteenth Day of September, 1990

Attest:

HARRY F. MANBECK, JR.

*Attesting Officer*     *Commissioner of Patents and Trademarks*